United States Patent
Lu

(10) Patent No.: US 6,647,137 B1
(45) Date of Patent: Nov. 11, 2003

(54) CHARACTERIZING KERNEL FUNCTION IN PHOTOLITHOGRAPHY BASED ON PHOTORESIST PATTERN

(75) Inventor: Ning Lu, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 645 days.

(21) Appl. No.: 09/612,887

(22) Filed: Jul. 10, 2000

(51) Int. Cl.$^7$ .................................................. G06K 9/00
(52) U.S. Cl. .......................................... 382/144; 378/35
(58) Field of Search ................................ 382/100, 112, 382/144, 212, 213, 214, 283, 286, 287; 430/302, 949; 349/4; 378/34, 35

(56) References Cited

U.S. PATENT DOCUMENTS

| | | | |
|---|---|---|---|
| 5,241,185 A | 8/1993 | Meiri et al. ............... 250/492.2 |
| 5,260,154 A | 11/1993 | Forrest ......................... 430/30 |
| 5,291,240 A | 3/1994 | Jain ............................. 355/53 |
| 5,331,370 A | 7/1994 | Rosner et al. ................. 355/53 |
| 5,440,653 A | 8/1995 | Greggain et al. ............. 382/298 |
| 5,774,601 A | 6/1998 | Mahmoodi .................. 382/298 |
| 5,790,254 A | 8/1998 | Ausschnitt .................. 356/603 |
| 5,847,959 A | * 12/1998 | Veneklasen et al. ........ 700/121 |
| 5,869,212 A | 2/1999 | Hashimoto .................... 430/5 |
| 5,879,844 A | 3/1999 | Yammamoto et al. ......... 430/30 |
| 6,081,658 A | * 6/2000 | Rieger et al. .................. 716/21 |
| 6,289,499 B1 | * 9/2001 | Rieger et al. .................. 716/21 |
| 6,556,702 B1 | * 4/2003 | Rishton et al. .............. 382/144 |

* cited by examiner

Primary Examiner—Andrew W. Johns
Assistant Examiner—Shervin Nakhjavan
(74) Attorney, Agent, or Firm—McGinn & Gibb, PLLC; Richard M. Kotulak, Esq.

(57) ABSTRACT

A method and structure for determining a range and a shape of a kernel function of a lithographic system which includes exposing, in the lithographic system, a photosensitive layer on a top surface of a substrate through a mask having a mask image, the mask image being of sufficient width to ensure a transferred image will not exhibit foreshortening but will exhibit corner rounding; developing the photosensitive layer to form the transferred image in the photosensitive layer; measuring a distance from an intersection of projected extensions of edges of the transferred image to a point along one edge where corner rounding starts; and defining the range of the kernel function as the measured distance. The projected extension edges are an unaltered version of the mask image overlaid on the transferred image and the foreshortening is a reduction in length of transferred images when compared to the mask image. Corner rounding occurs as a result of light diffraction and photosensitive layer development processes. The measuring simultaneously accommodates for the light diffraction and photosensitive layer development effects.

32 Claims, 5 Drawing Sheets

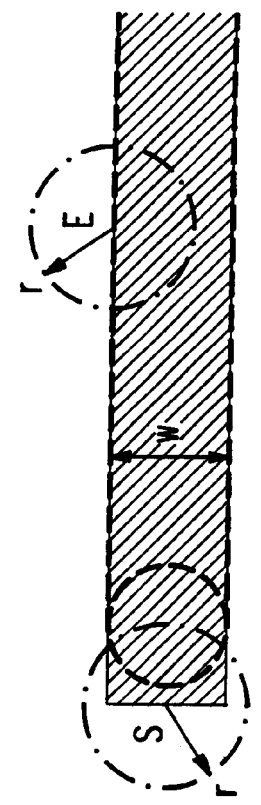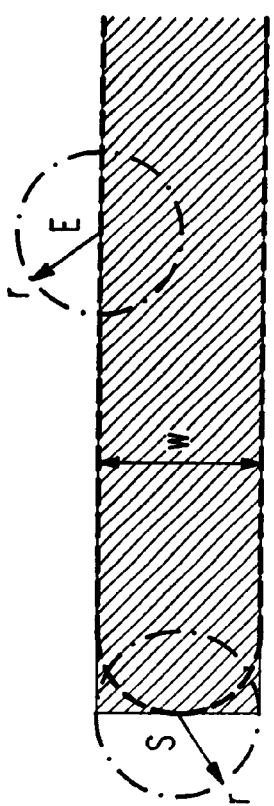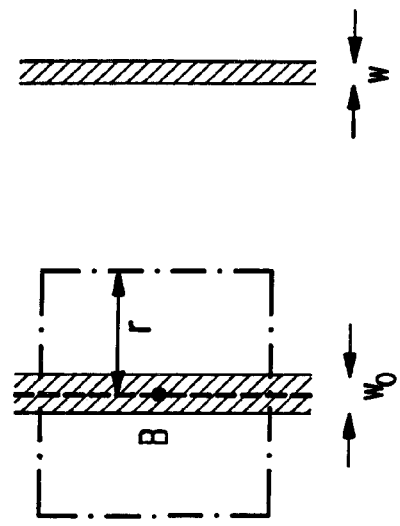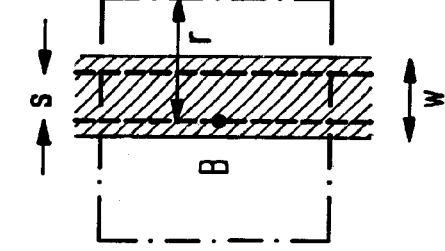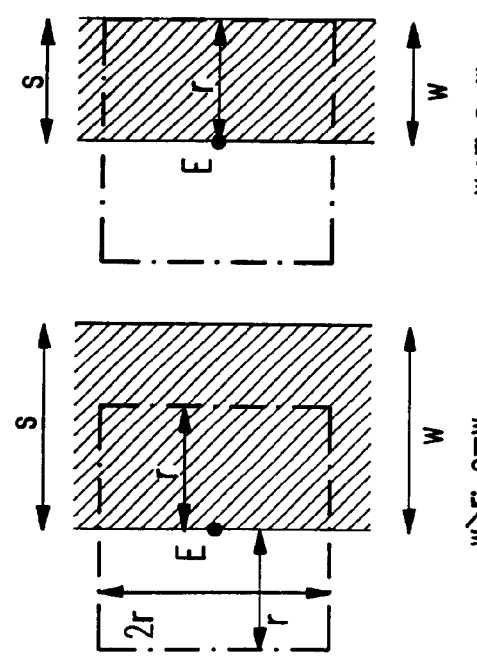

CHARACTERIZING KERNEL FUNCTION IN PHOTOLITHOGRAPHY BASED ON PHOTORESIST PATTERN

BACKGROUND OF THE INVENTION

1. Field of the Invention

The present invention generally relates to photoresist processing and the use of a kernel function to characterize the photolithography process for the purpose of reducing corner rounding and line-end foreshortening and more particularly relates to a method and system for identifying the range and shape of the kernel function based upon the difference between the photolithographic mask and the resist pattern.

2. Description of the Related Art

Photolithography is the technology of reproducing patterns using light. As presently used in the semiconductor industry, a photomask pattern for a desired circuit is transferred to a wafer through light exposure, development, etch, and resist strip, etc. As the feature sizes on a circuit become smaller and smaller, the circuit shape on the wafer differs from the original mask pattern more and more. In particular, corner rounding (see FIGS. 1, 2a, and 2b, discussed below), line-end foreshortening (see FIG. 2c, discussed below), different print biases between narrow and wide lines (see FIG. 3, discussed below), etc. are typically observed. These phenomena are called optical proximity effects.

One of the main reasons for optical proximity effects is light diffraction, resulting in the dependency of the aerial image of a feature on its surroundings. Moreover, the final photoresist image depends on both the aerial image from optical imaging process and the subsequent etch and photoresist development processes. Therefore, there is a need for a characterization of the whole lithography processes, including optical imaging process and subsequent etch and photoresist development processes. Such a characterization would provide the basis for correcting optical proximity effects and for improving photomask printability. Such a characterization would account for all aspect of the photolithographic process including the effects of the imaging light wavelength, the numerical aperture of the imaging projection system, the partial coherence factor σ, and the specific photoresist used.

SUMMARY OF THE INVENTION

It is, therefore, an object of the present invention to provide a structure and method for determining a range and a shape of a kernel function of a lithographic system which includes exposing, in the lithographic system, a photosensitive layer on a top surface of a substrate through a mask having a mask image, the mask image being of sufficient width to ensure a transferred image will not exhibit foreshortening but will exhibit corner rounding; developing the photosensitive layer to form the transferred image in the photosensitive layer; measuring a distance from an intersection of projected extensions of edges of the transferred image to a point along one edge where corner rounding starts; and defining the range of the kernel function as the measured distance. The projected extension edges are an unaltered version of the mask image overlaid on the transferred image and the foreshortening is a reduction in length of transferred images when compared to the mask image. Corner rounding occurs as a result of light diffraction and photosensitive layer development processes. The measuring simultaneously accommodates for the light diffraction and photosensitive layer development effects.

The invention can also comprise a method of determining a range and a shape of a kernel function of a lithographic system which includes exposing, in the lithographic system, a photosensitive layer on a top surface of a substrate through a mask having a plurality of mask images of decreasing widths; developing the photosensitive layer to form a plurality of corresponding transferred images in the photosensitive layer; comparing widths of the transferred images with widths of corresponding mask images; and defining the range of the kernel function as a smallest transferred image width that equals a corresponding mask image width. The comparing includes overlaying unaltered versions of the mask images on corresponding ones of the transferred images, wherein all transferred images having widths below the range of the kernel function are smaller than corresponding mask images. The difference between a mask image width and a corresponding transferred image width occurs as a result of light diffraction and photosensitive layer development processes, wherein comparing simultaneously accommodates for the light diffraction and photosensitive layer development effects.

BRIEF DESCRIPTION OF THE DRAWINGS

The foregoing and other objects, aspects and advantages will be better understood from the following detailed description of a preferred embodiment of the invention with reference to the drawings, in which:

FIGS. 2(a)–2(c) are schematic diagrams of a mask and exposed photoresist;

FIGS. 3(a)–3(e) are schematic diagrams of a mask and exposed photoresist;

DETAILED DESCRIPTION OF REFERRED EMBODIMENTS OF THE INVENTION

As mentioned above, there is a need for a characterization of the whole lithography processes, including optical imaging process and subsequent etch and photoresist development processes to provide the basis for correcting optical proximity effects and for improving photomask printability. The invention characterizes the kernel function in lithography based on the photoresist pattern.

More specifically, the invention uses a "total intensity" function and a threshold model for the "total intensity" to model the whole lithography processes. The total intensity function includes the effects of both aerial image from optical imaging process and subsequent etch and resist development processes. The threshold model represents the resist strip process, and predicts what will be printed based on the total intensity function and a threshold dose level. The total intensity function is either a simple convolution (m=1)

or the square of a convolution (m=2). The convolution is between a kernel function K(x, y) and the photomask used in the optical imaging process (e.g., see J. W. Goodman, *Introduction to Fourier Optics* (McGraw-Hill, New York, 1968), incorporated herein by reference).

This invention provides methods and systems for extracting an effective range r and specific shape of the kernel function K(x, y) based on the photoresist pattern. In a local coordinate system which centers at the point under consideration for calculating its aerial image, the kernel function K is substantially zero when its argument is larger than r: K(x, y)=0 when x>r and/or y>r for a square aperture (see FIG. 4, discussed below), and K(p)=0 when p>r for a circular aperture, (see FIG. 5, discussed below).

A. Kernel Function's Effective Range

In order to let some expressions be valid for both total intensity and aerial intensity, the following discussion assumes, that the clear region of a mask is inside the mask boundary and that a negative resist is used. However, one ordinarily skilled in the art would understand that the invention is equally applicable to different structures, such as chrome-on-glass masks using a positive photoresist. Further, the following discussion includes measurement of similarities and differences of masks and resulting resist patterns. The process of performing such calculations is well known to those ordinarily skilled in the art and will not be discussed herein, so as not to unnecessarily obscure the invention.

Figure 1:
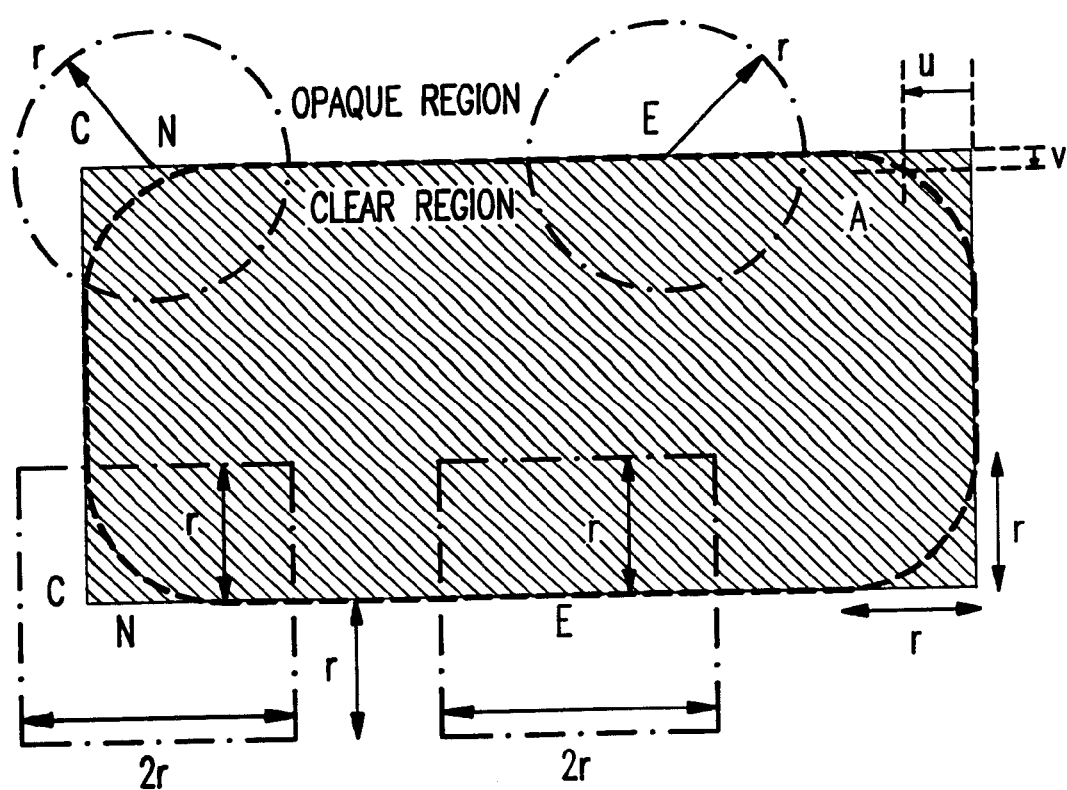
FIG. 1 is a schematic diagram of a mask and exposed photoresist.

In a first embodiment, the invention determines the effective range r from corner rounding size. More specifically, FIG. 1 shows a square rectangular mask (cross-hatched area) and corresponding rounded final photoresist pattern (area within dashed line) after light exposure, development, etch, and resist strip, etc. The cross-hatched area represents an opening or "clear" region within an opaque region. Corner rounding appears at each corner C. The following explains the reasons for the corner rounding seen in FIG. 1.

Figure 4:
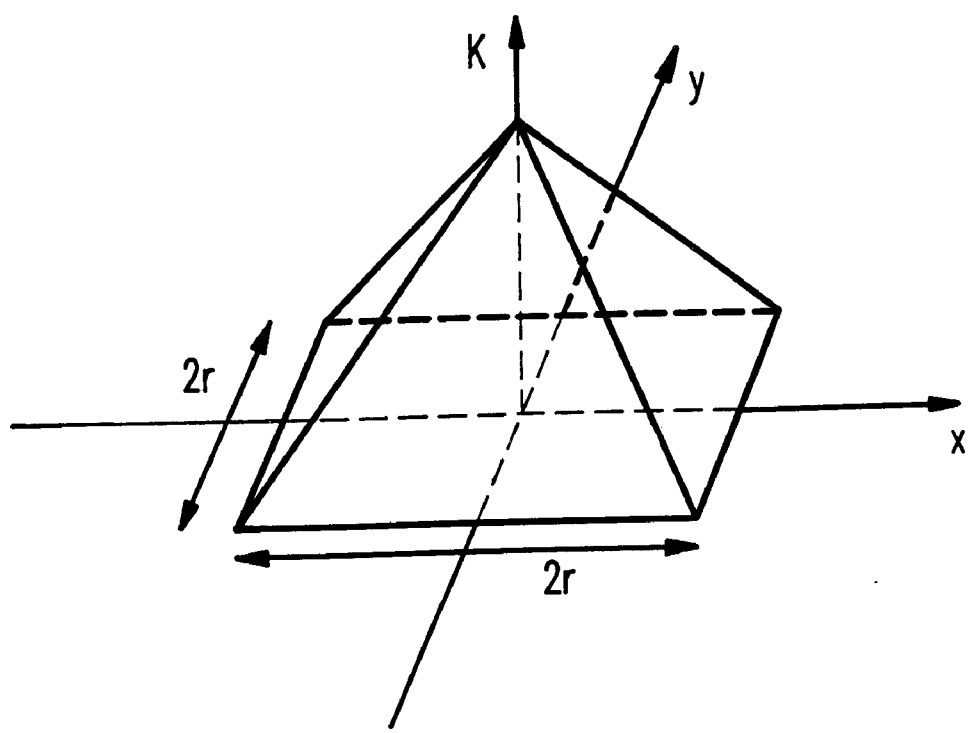
FIG. 4 is a schematic diagram of a square aperture kernel function.
Figure 5:
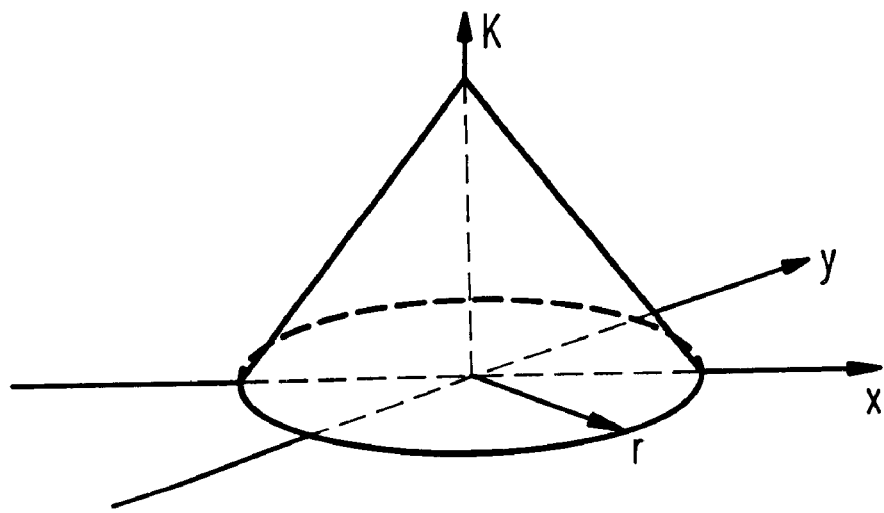
FIG. 5 is a schematic diagram of a round aperture kernel function.

Based on the above-mentioned convolution model (for either circular or square aperture), the invention models the total intensity at a point as given by (the square of) the convolution between the kernel function K(x, y) and the transmitted light intensity or amplitude around the point. The 3D pyramid-type or cone-type structures (see FIGS. 4 and 5) represent the kernel function K(x, y) that is centered at a point and has a horizontal range r. While FIGS. 4 and 5 illustrate 3D kernel functions, FIGS. 1–3(e) illustrate the kernel functions as circles or squares.

Namely, the total light intensity seen during mask exposure is proportional to (the square of) the volume of a cone-type or a pyramid-type 3D structure. The truncation of the kernel is done according to the actual light transmission around that point, which may be blocked by opaque regions in the photomask. For an edge point E (when its distance to its nearest corner is larger than r), after truncation to account for the half that is in the opaque region, the truncated kernel volume is half of the whole volume under the kernel function (i.e., half of whole volume of 3D a cone-type structure, such as that shown in FIG. 5). For a corner C, after truncation, the truncated kernel volume is one quarter of the whole volume under the kernel function.

Thus, the light intensity of the point C ($I_C$) is equal to the light intensity of the point E ($I_E$) divided by $2^m$ and is less that the light intensity of the point E. Thus, $I_C=I_E/2^m<I_E$. Further, this relationship holds independently of the range r and the form of the kernel function. The intensity contour line defining the resist shape (e.g., the dashed curve in FIG. 1) passing through the edge point E will not pass through the corner C; Rather, it passes through point A, which is inside the corner C.

To the contrary, for a near-corner edge point N, its distance to the corner C is less than r. Thus, its total light intensity $I_N$ is somewhat less than that at edge point E, but is larger than $I_C$. It is necessary to move inward to point A to get the same intensity as that at point E. Thus, the following relationship $I_C<I_N<I_E=I_A$ is known. Based on this geometric picture, it is easy to see that the effective range r of the kernel function is the distance between the corner C and an edge point at which the photoresist pattern starts to make turn (see FIG. 1). This method offers some flexibility on choosing the size of r.

Thus, in this embodiment, the invention calculates the effective range r by measuring the distance from a mask corner to a point along the mask pattern where the rounded corner of the resist rejoins the mask pattern.

Figure 2A:
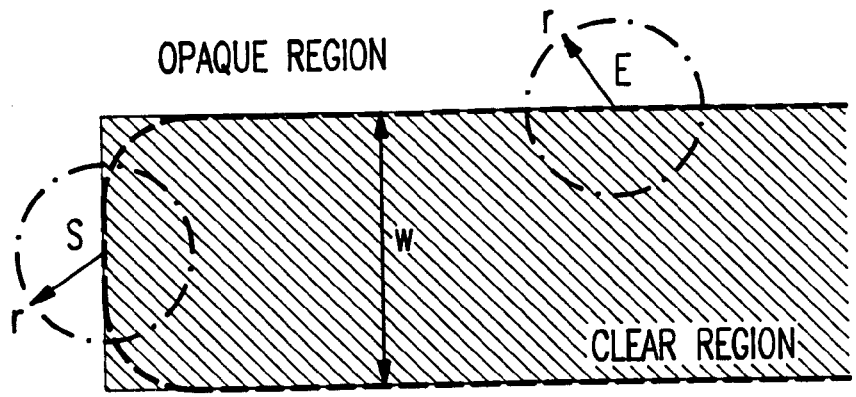

In another embodiment, the invention determines the effective range r from line-end foreshortening. More specifically, FIGS. 2(a)–2(c) show several isolated wires of different line widths and corresponding photoresist patterns, using the same conventions as used in FIG. 1. For each isolated wire, the exposure dose is adjusted to match two printed line edges with two mask edges. FIGS. 2(a)–2(c) illustrate the transition from "corner rounding alone" (FIG. 2a) to the merger of corner rounding (FIG. 2b) and further to the clear appearance of line-end shortening (FIG. 2c) as the width is decreased.

The effective range r of the kernel function K(x, y) can be identified as half of the wire width w in FIG. 2b. The reason is that, as the wire width is reduced, the shorter-edge's middle point S in FIG. 2b is the last case in which the middle point S has the same intensity as an edge point E. Consequently, 2r=w, as indicated by the dash-dotted kernel circles in FIG. 2b. Thus, in this embodiment, the invention calculates the effective range r by determining the minimum width a structure can reach before line-end foreshortening occurs and sets r equal to half the minimum width.

In another embodiment, the invention determines the effective range r from the narrowing of narrow line widths. More specifically, FIGS. 3(a)–3(e) show a set of isolated lines of different widths and corresponding resist patterns under the same exposure dose. The exposure dose is adjusted to match two printed edges with two mask edges for the widest line only (see FIG. 3(a)).

However, under the same exposure dose, the printed edges do not match mask edges of narrow lines. Usually, for narrow features, the printed line width s is equal to or smaller than the mask width w for such dosage (see FIG. 3(c)). Sometimes, the printed line width s may be slightly larger than the mask width w (not illustrated). At a certain mask line width ($w_0$), the two printed line edges actually merge into a single line (see FIG. 3(d)). Such a line-width-narrowing relationship is plotted in FIG. 6 which shows the resist width s on the vertical axis and the mask width w on the horizontal axis. Note that below that mask line width ($w_0$), the line is too narrow to be printable (as also show in FIG. 3(e)).

The effective range r of the kernel function K(x, y) can be identified as the full width w (in FIG. 3(b)), at which the printed width s just starts to be different from the mask width w. This point is graphically illustrated in FIG. 6. Thus, in this embodiment, the invention calculates the effective range r by determining the minimum width a structure can reach before the sides of the resist begin to diverge from the mask pattern and setting the range r equal to such a minimum width.

The invention determines the effective range r in a number of different ways including by observing the distance from a mask corner to the point where the resist shape rejoins the mask, and by setting r equal to the minimum width before line-end foreshortening occurs or the minimum width before the resist begins to diverge from the mask.

B. Kernel Function's Shape

As mentioned above, the invention includes a provision for determining the kernel function's shape, also based on the photoresist pattern. FIGS. 4 and 5 illustrate two different kernel functions, a square (pyramid) shape (FIG. 4) and a round (cone) shape (FIG. 5). While there are many types of kernel functions, these are the two most common types.

For the square aperture (e.g, as shown in FIG. 4), the invention models the 2D kernel function (see FIG. 4) as the product of two 1D kernel functions, where the 1D kernel function is symmetric:

$$K(x, y)=k(x)k(y), \quad k(x)=k(-x). \quad (1)$$

Based on the properties of the 2D kernel function $K(x, y)$, it is clear that $k(x)=0$ when $|x| \geq r$. The invention introduces an integration function, $$G(x) = \int_{-\infty}^{x} k(x')dx', \quad (2)$$

which has the properties: $G(x)=0$ if $x<-r$, $G(x)=G(r)$ if $x>r$, $G(0)=\frac{1}{2}G(r)$, and $$G(x)+G(-x)=G(r). \quad (3)$$

If the integration function $G(x)$ is known, then the 1 D kernel function $k(x)$ can be obtained from $G(x)$'s derivative:

$$k(x)=dG(x)/dx \quad (4)$$

In the following, this disclosure will focus on how to obtain the integration function $G(x)$. In one embodiment, the invention determines the kernel function's shape from corner rounding shape alone. The amount of corner rounding for a point A on the corner rounding curve is described by a pair of numbers u and v (see FIG. 1). From a given photoresist pattern, the invention can extract a relationship $f(u, v)=0$ between them. For example, the relationship could be in the form of a circle (n=2) or a super-circle (n>2): $f(u, v)=(r-u)^n+(r-v)^n-r^n=0$. Based on the convolution model, for an edge point E, the kernel's total intensity is $I_E=I_o\{[G(0)-G(-r)][G(r)-G(-r)]\}^m$. For an arbitrary point A on the corner rounding curve, its total intensity is $I_A=I_o\{[G(u)-G(-r)][G(v)-G(-r)]\}^m$. Here $I_o$ represents exposure dose, and m=1 or 2.

If both u and v are always non-negative, the invention can use m=1. This choice indicates that the kernel function $K(x, y)$ is non-negative everywhere, and the integration function $G(x)$ increases monotonically when its argument x increases. In other words, the invention characterize the whole lithography process (optical imaging process plus etch and resist development processes) as an incoherent-illumination process, which is suitable for a larger partial coherence factor α.

On the other hand, if u and/or v ever becomes negative (e.g., when the corner rounding curve ever goes outside the rectangular mask), then the invention chooses m=2. This choice indicates that the kernel function $K(x, y)$ is negative in certain region and that the integration function $G(x)$ does not always increase monotonically with increasing argument x. Namely, the invention characterizes the whole lithography process as a coherent-illumination process, which is suitable for a smaller partial coherence factor σ.

Since $G(-r)=0$, the invention gets from $I_A=I_E$, $$G(u)G(v)=\tfrac{1}{2}[G(r)]^2 \quad (5)$$

Equation (5) is a constant-product relation. At the middle of corner rounding curve the values of u and v are equal, i.e., u=v=a. It is clear from FIG. 1 that for a given pair of unequal u and v, one of them is larger than a and the othe is less than a. The invention further obtains from Eq. (5) the value of the integration function at the location x=a:

$$G(a)=G(r)/\sqrt{2} \quad (6)$$

From the symmetry relation (3), the following is observed $G(-a)=G(r)(1-1/\sqrt{2})$. Without loss of generality, the invention can set $G(r)=1$ (or to another positive number). Thus, the invention obtains $G(a)=1/\sqrt{2}=0.707$ and $G(-a)=1-1/\sqrt{2}=0.293$. In general, the value of the integration function $G(x)$ at other points cannot be easily determined from relation (5) alone, since there are two unknowns $G(u)$ and $G(v)$ but there is only one equation. The corner rounding shape $f(u, v)=0$ is used to obtain u from v or vice versa.

Figure 7:
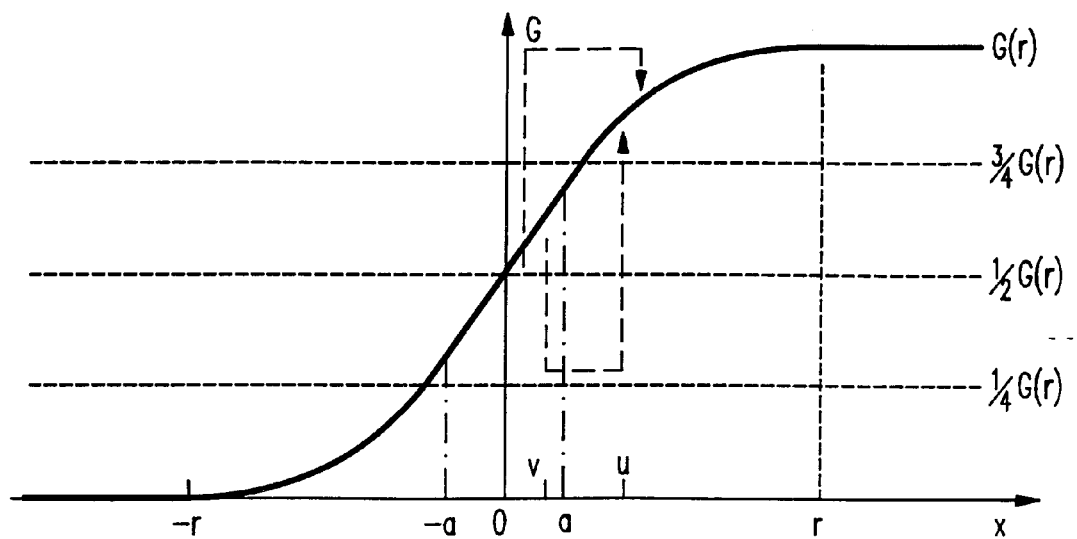
FIG. 7 is a graph illustrating a preferred method of the invention.

If it is assumed that the function $G(x)$ is linear in the central region $0 \leq x \leq a$ (this corresponds to the assumption that the kernel function $k(x)$ is constant in the same region), then the invention can determine the value of the integration function $G(x)$ in the other side of the region around x=a, i.e., in the region of $a \leq x \leq r$. This method is illustrated schematically in FIG. 7.

In the region of $0 \leq v \leq a$, the linearity assumption leads to $$G(v) = \left(\frac{1}{2} + \frac{\sqrt{2}-1}{2}\frac{v}{a}\right)G(r) \quad 0 \leq v \leq a$$

The corresponding u that satisfies $f(u, v)=0$ is in the region of $a<u<r$ and $G(u)$ is given by Eq. (5) and $G(v)$, above. A smaller v corresponds to a lager u as evident from FIG. 1. In other words, a pair of u and v are located on both sides of a pivot point x=a. Here, u and v obey the corner rounding curve $f(u,v)=0$. If $G(v)$ or $G(u)$ is known, then the other can be determined from Equation (5).

Therefore, this embodiment of the invention determines the shape of the integral of the kernel function by measuring the amount of corner rounding between the mask and the resist (e.g., by measuring u and v). This is described in general as $f(u, v)=0$. More specifically, the middle point of the corner rounding curve is measured and is labeled as a (i.e., u=v=a). The values of $G(O)$, $G(a)$, and $G(-a)$ are determined first. With a linear assumption for $G(x)$ in the central region of $-a<x \leq a$, the whole curve $G(x)$ can be determined from Eq. (5) and the corner rounding curve $j(u,v)=0$.

In another embodiment, the invention determines the kernel function's shape from line width narrowing alone (e.g., without considering corner rounding). Based on the convolution model, the total intensity at edge point E is given by $I_E=I_O\{[G(r)-G(0)][G(r)-G(-r)]\}^m$, and that at printed edge point B is given by $I_B=I_o\{[G(\frac{1}{2}(w+s))-G(-\frac{1}{2}(w-s))][G(r)-G(-r)]\}^m$, where $I_o$ represents the exposure dose. If the mask width w is always larger than or equal to the printed width s, then the invention can use m=1. On the other hand, if w<s for certain mask width w, then the invention must use m=2. Since both point E (in FIGS. 3(a)

and 3(b)) and point B (in FIG. 3(c) and 3(d)) are at the edge of printed lines, $I_E=I_B$. Consequently, the invention obtains the following relation:

$$G(\tfrac{1}{2}(w+s))-G(-\tfrac{1}{2}(w-s))=G(r)-G(0)=\tfrac{1}{2}G(r) \quad (7)$$

Figure 8:
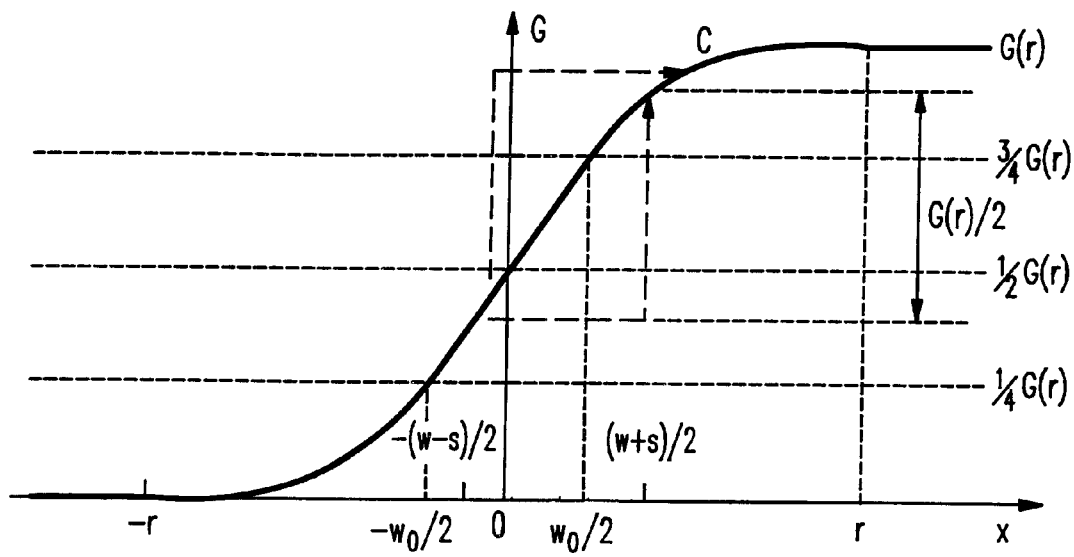
FIG. 8 is a graph illustrating a preferred method of the invention.

Equation (7) gives a constant-difference relation, and is illustrated in FIG. 8. Two points at $x=-\tfrac{1}{2}(w-s)$ and at $x=\tfrac{1}{2}(w+s)$ forms a pair, and their difference $G((\tfrac{1}{2}(w+s))-G(-\tfrac{1}{2}(w-s))$ is a constant, $\tfrac{1}{2}G(r)$.

Figure 6:
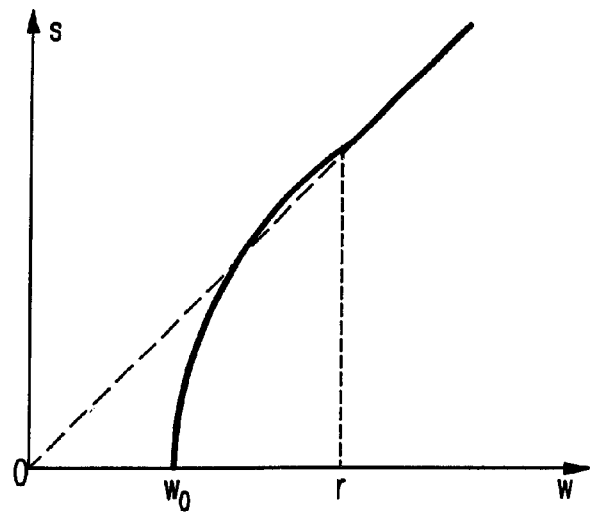
FIG. 6 is a graph illustrating a relationship between a printed width and a mask width.

Notice that when $s=0$, $w=w_0$, as illustrated in FIG. 3(d) and also in FIG. 6. Thus, when $G(-\tfrac{1}{2}(w-s))$ moves from $G(-w_0/2)$ to $G(0)$, $G(\tfrac{1}{2}(w+s))$ varies from $G(w_0/2)$ to $G(r)$ (see FIG. 8). Using the relation (3) and Eq. (7), $G(\tfrac{1}{2}w_0)-G(0)=\tfrac{1}{4}G(r)$. Thus, the invention obtains $$G(\tfrac{1}{2}w_0)=\tfrac{3}{4}G(r) \quad (8)$$

Using the symmetry relation (3) again, the invention produces $G(-\tfrac{1}{2}w_0)=\tfrac{1}{4}G(r)$. As in the corner rounding case, the value of the integration function $G(x)$ at other points cannot be obtained from relation (7) alone, since there are two unknowns but there is only one equation.

As an approximation, the invention assumes that the integration function $G(x)$ is a linear function for its center piece $-\tfrac{1}{2}w_0 \leq x \leq \tfrac{1}{2}w_0$ (this corresponds to the assumption that the kernel $k(x)$ is constant within the above region). Under such a linearity assumption, the value of the integration function $G(x)$ within the region of $\tfrac{1}{2}w_0 \leq x \leq r$ is obtained (see FIG. 8). By the symmetry relation (3), the integration function $G(x)$ value in the region $-r \leq x \leq -\tfrac{1}{2}w_0$ is also known.

Thus, this embodiment of the invention determines the shape of the integral of the kernel function by measuring the amount of line width narrowing. The line width narrowing is summarized into a curve $s=s(w)$ (see FIG. 6), where w is mask width and s is the width in photo resist pattern. The invention first determines the minimum mask width $w_0$ at which the resist pattern shrinks to a very narrow line and is about to disappear. Then $G(\tfrac{1}{2}w_0)$ and $G(-\tfrac{1}{2}w_0)$ as well as $G(0)$ are determined. Next, with a linearity assumption about the center piece $-\tfrac{1}{2}w_0 \leq x \leq \tfrac{1}{2}w_0$, the whole integration function $G(x)$ can be determined.

In the next embodiment, the invention combines corner rounding shape with line width narrowing, thereby eliminating the above linear assumption for the central part of $G(x)$, when determining the shape of the integral of the kernel function. Thus, this embodiment does not need to rely on any assumptions.

More specifically, this embodiment of the invention combines the known values of the integration function $G(x)$ at locations $x=-\tfrac{1}{2}w_0$, $-a$, $a$, and $\tfrac{1}{2}w_0$. These four points for the integration function $G(x)$ are labeled as points A', B', B, and A, respectively, in FIG. 9.

Figure 9:
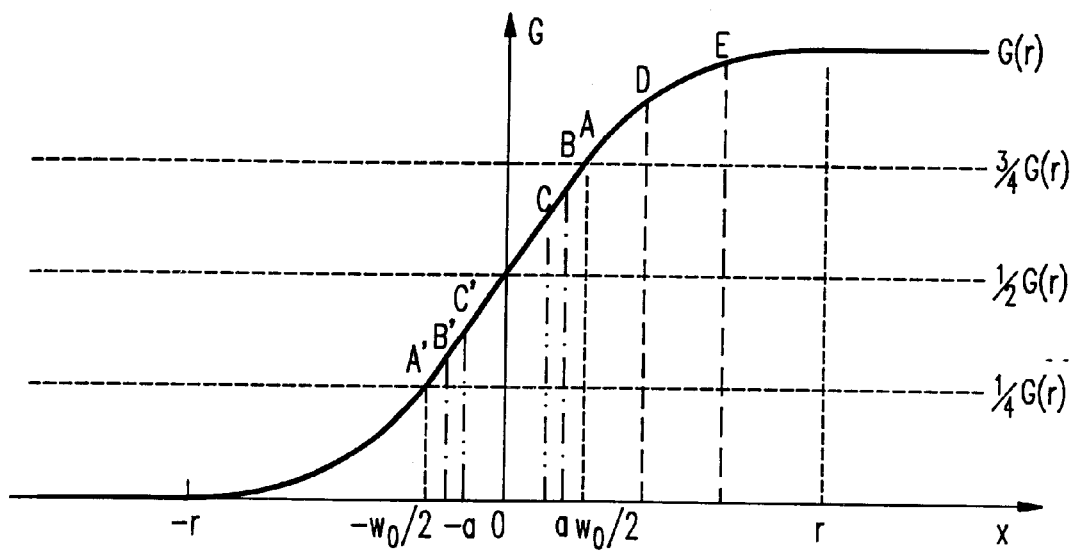
FIG. 9 is a graph illustrating a preferred method of the invention.

In the first round, from G's value at point A ($x=\tfrac{1}{2}w_0$), the invention uses constant-product relation (5) and the corner rounding shape $f(u, v)=0$ to obtain the value of $G(x)$ at point C (see FIG. 9). Thus, $G(x_c)=\tfrac{2}{3}G(r)$, where $x_c$ is determined from $f(x_c,\tfrac{1}{2}w_0)=0$. By symmetry relation (3), G's value at point C' is obtained from its values at point C: $G(-x_c)=\tfrac{1}{3}G(r)$.

In the second round, based on $G(x)$'s value at point B' ($x=-a$), the invention uses constant-difference relation (7) and the line narrowing relation $s=s(w)$ to obtain G's value at point D. Also, $$G(X_D) = \left(\frac{3}{2} - \frac{1}{\sqrt{2}}\right)G(r) = 0.793G(r),$$

where $x_D$ is determined from $x_D-a=(x_D+a)$. Similarly, the invention obtain G's value at point E from its value at point C', $$G(x_E) = \frac{5}{6}G(r),$$

where $x_E$ is determined from $x_E-xc=s(x_E+x_C)$.

In the third round, the invention uses constant-product relation (5) again, plus using G's value at points D and E to get G's values at two more points. Continuing in this sequence, the invention can obtain many points on the $G(x)$ curve, without any assumptions.

In a preferred embodiment, the invention stops this process after enough points are found. For the rest of the points, the invention uses the cubic spline or other well-known interpolation methods to get their values and thus obtain the whole curve of $G(x)$. From Eq. (4), the invention get the 1D kernel function $k(x)$ by taking the derivative. After 1D kernel function $k(x)$ is known, the invention obtains the 2D kernel function $K(x, y)$ from Eq. (1).

Thus, this embodiment of the invention determines the shape of the integral of the kernel function by measuring the corner rounding and the amount of line width narrowing. More specifically, both corner rounding shape $f(u,v)=0$ and isolated line width narrowing relation $s=s(w)$ are measured first. Then, the invention determines the values of the integration function $G(x)$ at four descrete points $x=-\tfrac{1}{2}w_0$, $-a$, $a$, $\tfrac{1}{2}w_0$ as well as the central point $G(0)$. Next, the values of $G(r)$ at many more discrete points are determined based on Eqs. (5) and (7). After the values of $G(x)$ at a sufficient number of discrete points are known, the invention uses an interpolation method to obtain a continuous cure $G(x)$. The derivative of continuous curve $G(x)$ is the one-dimensional kernel function $k(x)$.

Thus, the invention determines the kernel function $K(x, y)$ (e.g., both the effective range and shape) based only on photoresist pattern and the mask. In doing so, the invention characterizes the whole lithography process, including effects of both aerial image from optical imaging process and subsequent etch and resist development processes. Therefore, by measuring the difference between the mask shape and the printed resist shape, the invention accounts for the entire lithographic process.

The invention works especially well for square aperture, and provides a useful approximation for circular aperture. Further, as would be known by one ordinarily skilled in the art, given this disclosure, the invention is equally applicable for characterizing optical imaging process alone based on aerial image contour.

While the invention has been described in terms of preferred embodiments, those skilled in the art will recognize that the invention can be practiced with modification within the spirit and scope of the appended claims.

What is claimed is:

1. A method of determining a range of a kernel function of a lithographic system comprising:

exposing, in said lithographic system, a photosensitive layer on a top surface of a substrate through a mask having a mask image, said mask image being of sufficient width to ensure a transferred image will not exhibit foreshortening but will exhibit corner rounding;

developing said photosensitive layer to form said transferred image in said photosensitive layer;

measuring a distance from an intersection of projected extensions of edges of said transferred image to a point along one edge where corner rounding starts; and defining said range of said kernel function as said measured distance.

2. The method in claim 1, wherein said projected extension edges comprise an unaltered version of said mask image overlaid on said transferred image.

3. The method in claim 1, wherein said foreshortening comprises a reduction in length of transferred image when compared to said mask image.

4. The method in claim 1, wherein said corner rounding occurs as a result of light diffraction and photosensitive layer development processes.

5. The method in claim 4, wherein said measuring simultaneously accommodates for said light diffraction and photosensitive layer development effects.

6. A method of determining a range of a kernel function of a lithographic system comprising:

exposing, in said lithographic system, a photosensitive layer on a top surface of a substrate through a mask having a plurality of mask images of decreasing widths;

developing said photosensitive layer to form a plurality of corresponding transferred images in said photosensitive layer;

comparing widths of said transferred images with widths of corresponding mask images; and defining said range of said kernel function as a smallest transferred image width that equals a corresponding mask image width.

7. The method in claim 6, wherein said comparing includes overlaying unaltered versions of said mask images on corresponding ones of said transferred images.

8. The method in claim 6, wherein all transferred images having widths below said range of said kernel function are smaller than corresponding mask images.

9. The method in claim 6, wherein a difference between a mask image width and a corresponding transferred image width occurs as a result of light diffraction and photosensitive layer development processes.

10. The method in claim 9, wherein comparing simultaneously accommodates for said light diffraction and photosensitive layer development effects.

11. A method of determining a shape of an integral of a kernel function of a lithographic system comprising:

exposing, in said lithographic system, a photosensitive layer on a top surface of a substrate through a mask having a mask image, said mask image being of sufficient width to ensure a transferred image will not exhibit foreshortening but will exhibit corner rounding in a region at a corner of said transferred image;

developing said photosensitive layer to form said transferred image in said photosensitive coating;

defining a reference point as an intersection of projected extensions of the edges of said transferred image; and measuring x and y distances from said reference point to a plurality of points along said transferred image in said region of corner rounding to form a set value numerical evaluation of said integral of said kernel function.

12. The method in claim 11, wherein said projected extension edges comprise an unaltered version of said mask image overlaid on said transferred image.

13. The method in claim 11, wherein said foreshortening comprises a reduction in length of transferred image when compared to said mask image.

14. The method in claim 11, wherein said corner rounding occurs as a result of light diffraction and photosensitive layer development processes.

15. The method in claim 14, wherein said measuring simultaneously accommodates for said light diffraction and photosensitive layer development effects.

16. A method of determining a shape of an integral of a kernel function of a lithographic system comprising:

exposing, in said lithographic system, a photosensitive layer on a top surface of a substrate through a mask having a plurality of mask images of decreasing widths;

developing said photosensitive layer to form a plurality of corresponding transferred images in said photosensitive layer;

comparing widths of said transferred images with widths of corresponding mask images to determine line width narrowing; and forming a set value numerical evaluation of said integral of said kernel function based on said line width narrowing.

17. The method in claim 16, wherein said comparing includes overlaying unaltered versions of said mask images on corresponding ones of said transferred images.

18. The method in claim 16, wherein all transferred images having widths below said range of said kernel function are smaller than corresponding mask images.

19. The method in claim 16, wherein said line width narrowing occurs as a result of light diffraction and photosensitive layer development processes.

20. The method in claim 19, wherein comparing simultaneously accommodates for said light diffraction and photosensitive layer development effects.

21. A method of determining a shape of an integral of a kernel function of a lithographic system comprising:

exposing, in said lithographic system, a photosensitive layer on a top surface of a substrate through a mask having a plurality of mask images of decreasing widths, said mask image being of sufficient width to ensure first transferred images will not exhibit foreshortening but will exhibit corner rounding in a region at a corner of said transferred image;

developing said photosensitive layer to form said transferred image in said photosensitive coating;

defining a reference point as an intersection of projected extensions of the edges of said first transferred images;

measuring x and y distances from said reference point to a plurality of points along said first transferred images in said region of corner rounding;

comparing widths of second transferred images with widths of corresponding mask images to determine line width narrowing; and forming a set value numerical evaluation of said integral of said kernel function based on said line width narrowing and said measuring.

22. The method in claim 21, wherein said projected extension edges comprise an unaltered version of said mask image overlaid on said first transferred images.

23. The method in claim 21, wherein said foreshortening comprises a reduction in length of first transferred images when compared to said mask image.

24. The method in claim 21, wherein said comparing includes overlaying unaltered versions of said mask images on corresponding ones of said second transferred images.

25. The method in claim 21, wherein all of said second transferred images having widths below said range of said kernel function are smaller than corresponding mask images.

26. The method in claim 21, wherein said corner rounding and said line width narrowing occurs as a result of light diffraction and photosensitive layer development processes.

27. The method in claim 24, wherein said comparing and said measuring simultaneously accommodates for said light diffraction and photosensitive layer development effects.

28. A method of determining a range of a kernel function of a lithographic system comprising:

exposing, in said lithographic system, a photosensitive layer on a top surface of a substrate through a mask having a plurality of mask images of decreasing widths;

developing said photosensitive layer to form a plurality of corresponding transferred images in said photosensitive layer;

comparing widths of said transferred images with widths of corresponding mask images; and defining said range of said kernel function as half of a smallest transferred image width before line-end foreshortening occurs.

29. The method in claim 28, wherein said comparing includes overlaying unaltered versions of said mask images on corresponding ones of said transferred images.

30. The method in claim 28, wherein all transferred images having widths below said range of said kernel function exhibit line-end foreshortening.

31. The method in claim 28, wherein said line-end foreshortening occurs as a result of light diffraction and photosensitive layer development processes.

32. The method in claim 31, wherein comparing simultaneously accommodates for said light diffraction and photosensitive layer development effects.

* * * * *